United States Patent
Liu et al.

(10) Patent No.: US 11,728,202 B2
(45) Date of Patent: Aug. 15, 2023

(54) ELEMENT PICKUP DEVICE, METHOD FOR MANUFACTURING THE SAME AND METHOD FOR USING THE SAME

(71) Applicant: BOE TECHNOLOGY GROUP CO., LTD., Beijing (CN)

(72) Inventors: Yingwei Liu, Beijing (CN); Zhanfeng Cao, Beijing (CN); Muxin Di, Beijing (CN); Ke Wang, Beijing (CN); Zhiwei Liang, Beijing (CN); Renquan Gu, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 456 days.

(21) Appl. No.: 16/758,074

(22) PCT Filed: Jan. 29, 2019

(86) PCT No.: PCT/CN2019/073643
§ 371 (c)(1),
(2) Date: Apr. 22, 2020

(87) PCT Pub. No.: WO2020/154884
PCT Pub. Date: Aug. 6, 2020

(65) Prior Publication Data
US 2021/0217646 A1   Jul. 15, 2021

(51) Int. Cl.
*B32B 43/00* (2006.01)
*H01L 21/683* (2006.01)
(Continued)

(52) U.S. Cl.
CPC .... *H01L 21/6838* (2013.01); *H01L 21/67742* (2013.01); *H01L 33/62* (2013.01);
(Continued)

(58) Field of Classification Search
CPC ............ B32B 43/006; Y10T 156/1168; Y10T 156/19; H01L 21/6838
See application file for complete search history.

(56) References Cited

U.S. PATENT DOCUMENTS 8,936,832 B2 * 1/2015 Brugger ............ H01L 21/67051
438/758
2007/0175024 A1   8/2007 Nakatami et al.
(Continued)

FOREIGN PATENT DOCUMENTS

CN   102308377 A   1/2012
CN   103357584 A   10/2013
(Continued)

OTHER PUBLICATIONS

International Search Report issued in International Application No. PCT/CN2019/073643, dated Oct. 12, 2019, 6 pages.
(Continued)

*Primary Examiner* — Philip C Tucker
*Assistant Examiner* — Nickolas R Harm
(74) *Attorney, Agent, or Firm* — Dave Law Group LLC; Raj S. Dave

(57) ABSTRACT

The present disclosure relates to an element pickup device, a method for manufacturing the same and a method for using the same. The element pickup device includes: a first substrate and a second substrate oppositely disposed; a spacing part located between the first substrate and the second substrate, wherein the spacing part is spaced apart from each other to define a flow channel for liquid; and an element pickup part including an opening located in the second substrate and in communication with the flow channel.

20 Claims, 11 Drawing Sheets

(51) Int. Cl.
*H01L 21/677* (2006.01)
*H01L 33/62* (2010.01)

(52) U.S. Cl.
CPC ........ *B32B 43/006* (2013.01); *Y10T 156/1168* (2015.01); *Y10T 156/19* (2015.01)

(56) References Cited

U.S. PATENT DOCUMENTS

| | | |
|---|---|---|
| 2010/0226745 A1 | 9/2010 | Umehara et al. |
| 2011/0150702 A1 | 6/2011 | Kim et al. |
| 2015/0214088 A1 | 7/2015 | Nakao et al. |
| 2016/0204017 A1 | 7/2016 | Roesner et al. |

FOREIGN PATENT DOCUMENTS

| | | |
|---|---|---|
| CN | 105789127 A | 7/2016 |
| CN | 108461439 A | 8/2018 |
| CN | 109891569 A | 6/2019 |
| JP | 2007235123 A | 9/2007 |
| JP | 2015035548 A | 2/2015 |
| JP | 2016112498 A | 6/2016 |
| WO | 2013140888 A1 | 9/2013 |

OTHER PUBLICATIONS

Written Opinion of International Search Authority n International Application No. PCT/CN2019/073643, dated Oct. 6, 2019, 4 pages.
Office action issued for Chinese Application No. 201980000090.5, dated Sep. 28, 2022, 23 pages.

\* cited by examiner

ELEMENT PICKUP DEVICE, METHOD FOR MANUFACTURING THE SAME AND METHOD FOR USING THE SAME

CROSS-REFERENCE TO RELATED APPLICATIONS

This application claims priority of PCT international application PCT/CN2019/073643, filed on Jan. 29, 2019, the entire content of which is incorporated herein by reference as part of this application.

TECHNICAL FIELD

Embodiments of the present disclosure relate to a field of displaying technology, in particular, to an element pickup device, a method for manufacturing the same and a method for using the same.

BACKGROUND

Micro light emitting diode (Micro-LED) display technology has the advantages of both liquid crystal display (LCD) and organic light emitting diode (OLED) and overcomes the problem of short lifetime for displaying blue light by OLED display. Micro-LED can be applied to displaying from augmented reality (AR) displaying or virtual reality (VR) displaying to billboards displaying and movie screens displaying. Meantime, Micro-LED display technology is also suitable for flexible wearable devices.

BRIEF DESCRIPTION

Embodiments of the present disclosure provide an element pickup device, a method for manufacturing the same and a method for using the same.

In one aspect of the present disclosure, an element pickup device is provided. The element pickup device includes: a first substrate and a second substrate oppositely disposed; a spacing part located between the first substrate and the second substrate, wherein the spacing part is spaced apart from each other to define a flow channel for liquid; and an element pickup part including an opening located in the second substrate and in communication with the flow channel.

In an embodiment of the present disclosure, an orthographic projection of at least a portion of the opening adjacent to the first substrate on the first substrate is located within an orthographic projection of the flow channel on the first substrate.

In an embodiment of the present disclosure, a shape of a section of the opening perpendicular to a plane where the second substrate is located is rectangular.

In an embodiment of the present disclosure, the opening includes a first portion and a second portion in communication with each other. The first portion is located on a side of the second substrate facing the first substrate, and the second portion is located on a side of the second substrate away from the first substrate.

In an embodiment of the present disclosure, a first section of the first portion along a plane parallel to the first substrate is not smaller than a second section of the second portion along the plane parallel to the first substrate.

In an embodiment of the present disclosure, a first section of the first portion along a plane parallel to the first substrate is not lager than a second section of the second portion along the plane parallel to the first substrate.

In an embodiment of the present disclosure, a size of a first section of the first portion along a plane parallel to a plane where the first substrate is located is inversely proportional to a distance from the first section to the first substrate. A size of a second section of the second portion along a plane parallel to a plane where the first substrate is located is proportional to a distance from the second section to the first substrate.

In an embodiment of the present disclosure, the opening further includes a third portion located between the first portion and the second portion. A third section of the third portion along a plane parallel to a plane where the first substrate is located is not larger than the first section and the second section.

In an embodiment of the present disclosure, the opening includes a first opening and a second opening spaced apart.

In an embodiment of the present disclosure, the element pickup device further includes: a first electrode located on a side of the first substrate facing the second substrate; a first hydrophobic layer located on a side of the first electrode facing the second substrate; and a second hydrophobic layer located on a side of the second substrate facing the first substrate. An orthographic projection of the second hydrophobic layer on the first substrate does not overlap with an orthographic projection of a portion of the opening adjacent to the first substrate on the first substrate.

In an embodiment of the present disclosure, the first electrode includes a plurality of first sub-electrodes. The plurality of first sub-electrodes are spaced apart from each other along an extending direction of the flow channel.

In an embodiment of the present disclosure, the element pickup device further includes a second electrode located between the second substrate and the second hydrophobic layer. An orthographic projection of the second electrode on the first substrate is located within an orthographic projection of the second hydrophobic layer on the first substrate.

In an embodiment of the present disclosure, the element pickup device further includes: a thin film transistor located between the first substrate and the first electrode; a first dielectric layer located between the thin film transistor and the first electrode, wherein an orthographic projection of the thin film transistor on the first substrate overlaps with an orthographic projection of the first electrode on the first substrate; and a second dielectric layer located between the first electrode and the first hydrophobic layer.

In an embodiment of the present disclosure, the element pickup device further includes a suction device in communication with the flow channel.

In an embodiment of the present disclosure, the spacing part includes a hydrophobic material.

In one aspect of the present disclosure, a method for manufacturing the element pickup device as described above is provided. The method includes: providing a first substrate; providing a second substrate; forming spacing parts on the first substrate or on the second substrate, the spacing parts being spaced apart from each other; forming element pickup parts on the second substrate, the element pickup part being formed to include an opening located in the second substrate; and joining the first substrate and the second substrate so that the spacing parts are located between the first substrate and the second substrate to define a flow channel for fluid, wherein the opening is in communication with the flow channel.

In an embodiment of the present disclosure, an orthographic projection of at least a portion of the opening adjacent to the first substrate on the first substrate is located within an orthographic projection of the flow channel on the first substrate.

In an embodiment of the present disclosure, providing the first substrate includes forming a first electrode on the first substrate, and forming a first hydrophobic layer on the first substrate and the first electrode. Providing the second substrate includes forming a second hydrophobic layer on the second substrate. The first substrate and the second substrate are joined so that the first hydrophobic layer and the second hydrophobic layer are opposed to each other. After the joining, an orthographic projection of the second hydrophobic layer on the first substrate does not overlap with an orthographic projection of a portion of the opening adjacent to the first substrate on the first substrate.

In an embodiment of the present disclosure, the first electrodes are formed to be spaced apart from each other along an extending direction of the flow channel.

In an embodiment of the present disclosure, providing the second substrate further includes forming a second electrode on the second substrate before forming the second hydrophobic layer. An orthographic projection of the second electrode on the second substrate is located within an orthographic projection of the second hydrophobic layer on the second substrate.

In one aspect of the present disclosure, a method for using the element pickup device as described above is provided. The method includes: introducing a droplet into the flow channel; moving the droplet to the opening along the flow channel to adsorb an element to be picked up by the droplet; and moving the droplet away from the opening along the flow channel to desorb the element.

In an embodiment of the present disclosure, moving the droplet to the opening along the flow channel includes applying a first pressure to the droplet. Moving the droplet away from the opening along the flow channel includes applying a second pressure to the droplet.

In an embodiment of the present disclosure, the element pickup device further includes a first electrode located on a side of the first substrate facing the second substrate, a first hydrophobic layer located on a side of the first electrode facing the second substrate, and a second hydrophobic layer located on a side of the second substrate facing the first substrate. The method includes applying a first voltage to the first electrode to move the droplet to the opening along the flow channel to adsorb the element to be picked up by the droplet, and applying a second voltage to the first electrode to move the droplet away from the opening along the flow channel to desorb the element.

In an embodiment of the present disclosure, the element pickup device further includes a second electrode located between the second substrate and the second hydrophobic layer. Applying a first voltage to the first electrode to move the droplet to the opening along the flow channel to adsorb the element to be picked up by the droplet further includes applying a third voltage different from the first voltage to the second electrode when the first voltage is applied. Moving the droplet away from the opening along the flow channel to desorb the element further includes applying a fourth voltage different from the second voltage to the second electrode when the second voltage is applied.

In an embodiment of the present disclosure, a surface of the element is subjected to a hydrophilic treatment before picking up the element In an embodiment of the present disclosure, a method for performing a hydrophilic treatment on the surface of the element includes performing an oxygen plasma treatment on the surface of the element or applying a surfactant to the surface of the element.

In an embodiment of the present disclosure, the surfactant includes sodium dodecyl sulfate, polyethylene glycol, polyvinyl alcohol, or polymethacrylic acid.

In an embodiment of the present disclosure, the element includes a micro light emitting diode chip.

Adaptive and further aspects and scope will become apparent from the description provided herein. It should be understood that various aspects of this disclosure may be implemented individually or in combination with one or more other aspects. It should also be understood that the description and specific examples herein are intended for purposes of illustration only and are not intended to limit the scope of the present disclosure.

BRIEF DESCRIPTION OF THE DRAWINGS

The drawings described herein are for illustrative purposes only of selected embodiments and not all possible implementations, and are not intended to limit the scope of the present application.

Corresponding reference numerals indicate corresponding parts or features throughout the several views of the drawings.

DETAILED DESCRIPTION

Figure 1:
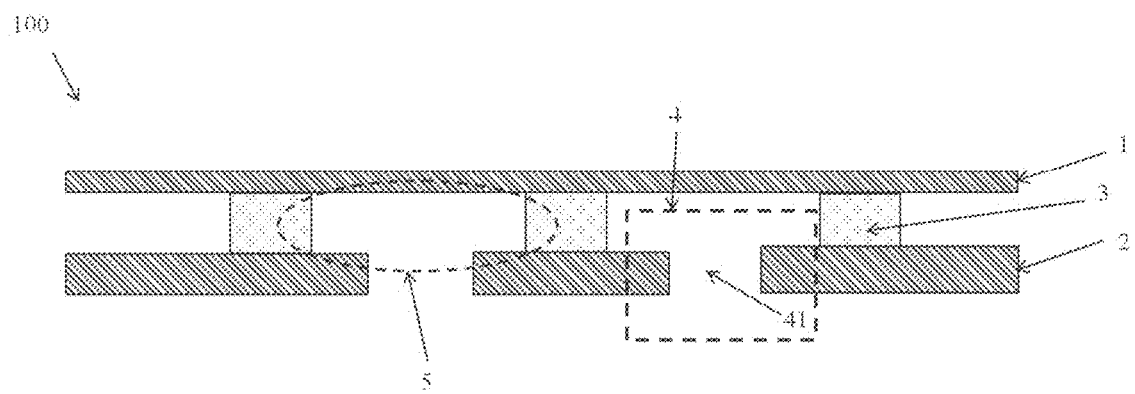
FIG. 1 shows a schematic view of a cross-sectional structure of an element pickup device according to an embodiment of the present disclosure.

As used herein and in the appended claims, the singular form of a word includes the plural, and vice versa, unless the context clearly dictates otherwise. Thus, the references "a", "an", and "the" are generally inclusive of the plurals of the respective terms. Similarly, the words "comprise", "comprises", and "comprising" are to be interpreted inclusively rather than exclusively. Likewise, the terms "include", "including" and "or" should all be construed to be inclusive, unless such a construction is clearly prohibited from the context. The term "example" used herein, particularly when followed by a listing of terms, is merely exemplary and illustrative and should not be deemed to be exclusive or comprehensive.

Additionally, further to be noted, when the elements and the embodiments thereof of the present application are introduced, the articles "a/an", "one", "the" and "said" are intended to represent the existence of one or more elements. Unless otherwise specified, "a plurality of" means two or more. The expressions "comprise", "include", "contain" and "have" are intended as inclusive and mean that there may be other elements besides those listed. The terms such as "first" and "second" are used herein only for purposes of description and are not intended to indicate or imply relative importance and the order of formation.

In addition, in the drawings, the thickness and area of each layer are exaggerated for clarity. It should be understood that when a layer, a region, or a element is referred to as being "on" another part, it is meant that it is directly on the another part, or there may be other elements in between. In contrast, when a certain element is referred to as being "directly" on another element, it is meant that no other element lies in between.

The flow views depicted herein are just one example. There may be many variations to this view or the steps (or operations) described therein without departing from the spirit of the disclosure. For instance, the steps may be performed in a differing order or steps may be added, deleted or modified. All of these variations are considered a part of the claimed disclosure.

Exemplary embodiments will now be described more fully with reference to the accompanying drawings.

Micro-LED technology is a technology that installs millions of micro-level (<100 μm) Micro-LED (for example, RGB Micro-LEDs) chips on the driving backboard through massive transfer technology. Each Micro-LED can be driven individually to emit light. Since the Micro-LED is made of inorganic light emitting materials, the Micro-LED overcomes the shortcomings such as screen burning and short lifetime that occur in screens using organic light emitting elements. In addition, Micro-LED has the advantages of fast response speed, high contrast, high color saturation, achieving ultra-high resolution, simple structure, and being thin, light and bendable.

At present, one of the key technologies limiting the development of Micro-LED technology is the massive transfer technology, that is, how to transfer a large number of micrometer-sized Micro-LED chips to the driving backboard. According to the principle of adsorption, the adsorption force for Micro-LED chips generally includes charge attraction, magnetic attraction, adhesion force, intermolecular force and so on. However, there is still a need for improved mass transfer technology.

The present disclosure provides an element pickup device, a method for manufacturing the same, and a method for using the same, which can transfer Micro-LED chips using physical force. Specifically, the chip can be transferred by the surface tension of the droplet, so that the influence of static electricity on the chip can be prevented, the chip can be continuously transferred, and the picking up and dropping of the chip can be precisely controlled.

FIG. 1 shows a schematic view of a cross-sectional structure of an element pickup device according to an embodiment of the present disclosure. As shown in FIG. 1, the element pickup device 100 includes: a first substrate 1 and a second substrate 2 oppositely disposed, a spacing part 3 and an element pickup part 4. The spacing part 3 is located between the first substrate 1 and the second substrate 2. The spacing part 3 are spaced apart from each other to define a flow channel 5 for liquid (not shown). The element pickup part 4 includes an opening 41 located in the second substrate 2 and in communication with the flow channel 5. In an embodiment of the present disclosure, the element pickup part 4 can adsorb an element to be picked up by the surface tension of the liquid, thereby realizing the transfer of the chip.

In an embodiment of the present disclosure, an orthographic projection of at least a portion of the opening 41 adjacent to the first substrate 1 on the first substrate 1 is within an orthographic projection of the flow channel 5 on the first substrate 1. Thereby, when picking up the element, the amount of the liquid film formed by the liquid in the portion of the opening 41 facing away from the first substrate 1 in the flow channel 5 can be better controlled, thereby picking up the element more efficiently.

In an embodiment of the present disclosure, as shown in FIG. 1, a shape of a section of the opening 41 perpendicular to a plane where the second substrate 2 is located may be rectangular.

Figure 2:
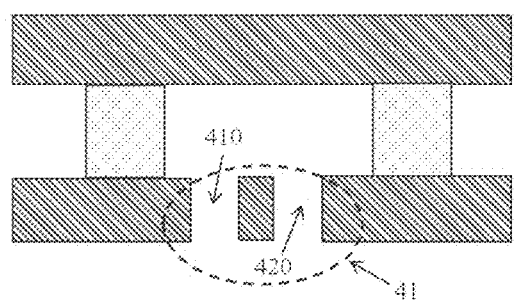
FIG. 2 shows a schematic view of a cross-sectional structure of an opening of an element pickup part according to an embodiment of the present disclosure.

FIG. 2 shows a schematic view of a cross-sectional structure of an opening of an element pickup part according to an embodiment of the present disclosure. As shown in FIG. 2, the opening 41 may include a first opening 410 and a second opening 420 spaced apart. It should be noted that the detailed description of the first opening 410 and the second opening 420 is similar to that described above regarding the opening 41 and will not be repeated here.

According to an embodiment of the present disclosure, the opening 41 may include a first portion 411 and a second portion 412 in communication with each other. The first portion 411 is located on a side of the second substrate 2 facing the first substrate 1. The second portion 412 is located on a side of the second substrate 2 away from the first substrate 1. By adjusting the size of the second portion to be suitable for receiving the element to be picked up, it is possible to effectively prevent the element from shaking after being picked up and avoid causing other potential problems.

Figure 3:
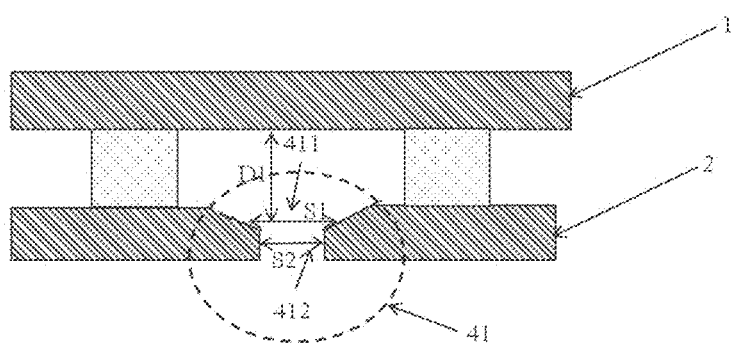
FIG. 3 shows a schematic view of a cross-sectional structure of an opening of an element pickup part according to an embodiment of the present disclosure.

FIG. 3 shows a schematic view of a cross-sectional structure of an opening of an element pickup part according to an embodiment of the present disclosure. As shown in FIG. 3, in some embodiments, a first section S1 of the first portion 411 of the opening 41 along a plane parallel to a plane where the first substrate 1 is located is not smaller than a second section S2 of the second portion 412 of the opening 41 along a plane parallel to the plane where the first substrate 1 is located. In some embodiments, a size of the first section S1 is inversely proportional to a distance D1 from the first section S1 to the first substrate 1. For example, when the distance D1 is smaller, the size of the first section S1 is larger. It should be noted that the size of the section herein may refer to the area of the section, for example.

Figure 4:
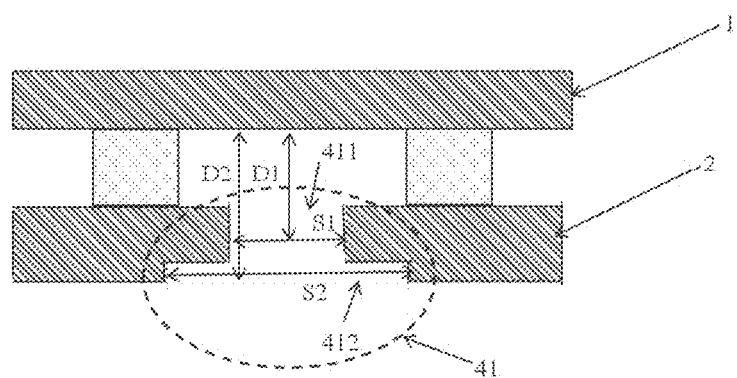
FIG. 4 shows a schematic view of a cross-sectional structure of an opening of an element pickup part according to an embodiment of the present disclosure.

FIG. 4 shows a schematic view of a cross-sectional structure of an opening of an element pickup part according to an embodiment of the present disclosure. As shown in FIG. 4, the first section S1 of the first portion 411 of the opening 41 along the plane parallel to the plane where the first substrate 1 is located is not larger than the second section S2 of the second portion 412 along the plane parallel to the plane where the first substrate 1 is located. In some embodiments, the size of the first section S1 does not change with a change of the distance D1 from the first section S1 to the first substrate 1, and the size of the second section S2 does not change with a change of the distance D2 from the second section S2 to the first substrate 1. For example, when the distance D1 is smaller or larger, the size of the first section S1 does not change. It should be noted that the size of the section herein may refer to the area of the section, for example.

Figure 5:
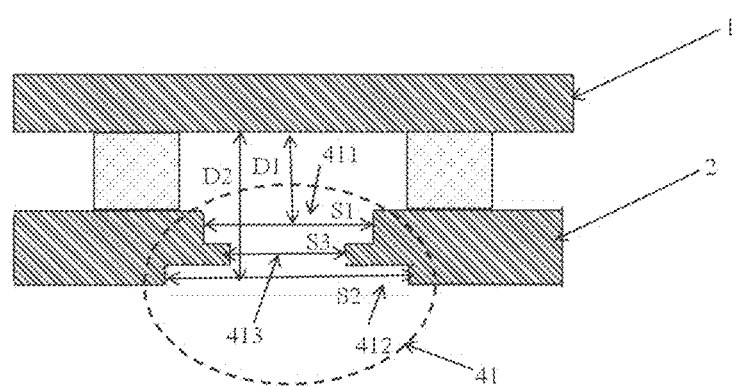
FIG. 5 shows a schematic view of a cross-sectional structure of an opening of an element pickup part according to an embodiment of the present disclosure.

FIG. 5 shows a schematic view of a cross-sectional structure of an opening of an element pickup part according to an embodiment of the present disclosure. As shown in FIG. 5, on the basis of FIG. 4, the opening 41 further includes a third portion 413 located between the first portion 411 and the second portion 412. A third section S3 of the third portion 413 along the plane parallel to the plane where the first substrate 1 is located is not larger than the first section S1 and the second section S2.

It should be noted that the second section S2 is not smaller than the first section S1 in FIG. 4, and the second section S2 is not smaller than the first section S1 and the third section S3 in FIG. 5.

Figure 6:
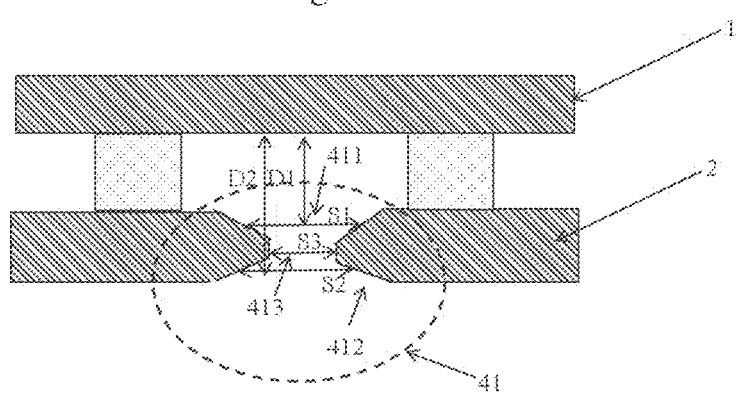
FIG. 6 shows a schematic view of a cross-sectional structure of an opening of an element pickup part according to an embodiment of the present disclosure.

FIG. 6 shows a schematic view of a cross-sectional structure of an opening of an element pickup part according to an embodiment of the present disclosure. As shown in FIG. 6, the size of the first section S1 of the first portion 411 of the opening 41 along the plane parallel to the plane where the first substrate 1 is located is inversely proportional to the distance D1 from the first section S1 to the first substrate 1. The size of the second section S2 of the second portion 412 of the opening 41 along the plane parallel to the plane where the first substrate 1 is located is proportional to the distance D2 from the second section S2 to the first substrate 1. For example, when the distance D1 is smaller, the size of the first section S1 is larger; when the distance D2 is smaller, the size of the second section S2 is smaller.

In addition, the opening 41 in FIG. 6 further includes a third portion 413 located between the first portion 411 and the second portion 412. A third section S3 of the third portion 413 along the plane parallel to the plane where the first substrate 1 is located is not larger than the first section S1 and the second section S2.

It should be noted that, in FIGS. 4 to 6, the portion of the second section S2 away from the first substrate 1 has a larger size of the section, which is beneficial for forming a water film with a larger area to increase the adsorption area, thereby adsorption force for the element increases and the element can be picked up more efficiently.

It should be noted that, in the case where the opening 41 includes a plurality of openings, the opening 41 may have one or more of the opening structures in FIGS. 1 to 6 or a combination thereof, which will not be specifically limited herein.

Figure 7A:
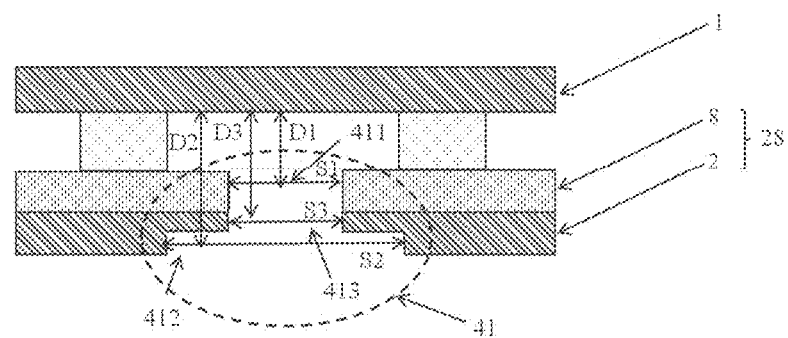
FIGS. 7a and 7b show schematic views of cross-sectional structures of an opening of an element pickup part according to an embodiment of the present disclosure.
Figure 7B:
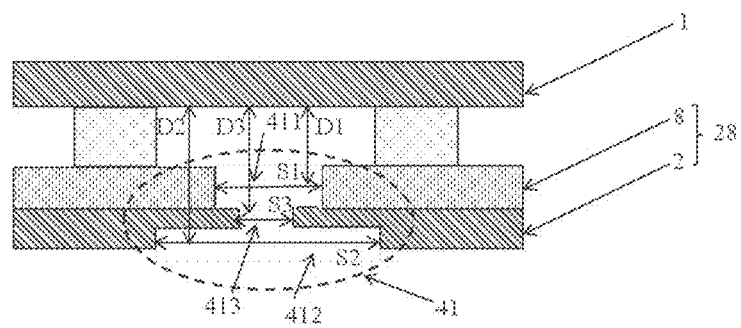

According to an embodiment of the present disclosure, the opening 41 may be located in a laminated structure 28, as shown in FIGS. 7a and 7b.

In FIGS. 7a and 7b, the laminated structure 28 may include the second substrate 2 and a hydrophobic layer 8 (as described later with reference to FIG. 8) located on the second substrate 2. In this embodiment, the opening 41 may include a first opening portion 411 (hereinafter referred to as a first portion 411), a second opening portion 412 (hereinafter referred to as a second portion 422), and a third opening portion 413 (hereinafter referred to as a third portion 413) in communication with each other. In an embodiment of the present disclosure, the first portion 411 is located in the hydrophobic layer 8. The second portion 412 is located on a side of the second substrate 2 away from the first substrate 1. The third portion 413 is located on a side of the second substrate 2 facing the first substrate 1.

In some embodiments, as shown in FIG. 7a, a first section S1 of the first portion 411 of the opening 41 along the plane parallel to the plane where the first substrate 1 is located is not larger than a second section S2 of the second portion 412 along the plane parallel to the plane where the first substrate 1 is located. The first section S1 of the first portion 411 of the opening 41 along the plane parallel to the plane where the first substrate 1 is located is equal to a third section S3 of the third portion 413 along the plane parallel to the plane where the first substrate 1 is located.

In some embodiments, as shown in FIG. 7b, the first section S1 of the first portion 411 of the opening 41 along the plane parallel to the plane where the first substrate 1 is located is not larger than the second section S2 of the second portion 412 along the plane parallel to the plane where the first substrate 1 is located. The third section S3 of the third portion 413 of the opening 41 along the plane parallel to the plane where the first substrate 1 is located is not larger than the first section S1 of the first portion 411 along the plane parallel to the plane where the first substrate 1 is located.

In addition, in FIGS. 7a and 7b, the size of the first section S1 does not change as the distance D1 from the first section S1 to the first substrate 1 changes. The size of the second section S2 does not change as the distance D2 from the second section S2 to the first substrate 1 changes. The size of the third section S3 does not change as the distance D3 from the third section S3 to the first substrate 1 changes. For example, when the distance D1 is smaller or larger, the size of the first section S1 does not change. It should be noted that the size of the section herein may refer to the area of the section, for example.

The detailed description of other embodiments of the opening 41 in the laminated structure is similar to the description of the opening 41 as described above with reference to FIGS. 1 to 6, which will not be repeated here.

In addition, it should be noted that FIGS. 7a and 7b only show schematic views of cross-sectional structures of the two openings 41 in the laminated structures, which should not be regarded as a limit to the present disclosure. A person skilled in the art may adopt any one or combination of the opening structures described above with reference to FIGS. 1 to 6 according to actual needs.

In an embodiment of the present disclosure, on the basis of the element pickup device 100 shown in FIG. 1, the element pickup device 100 further includes a suction device (not shown) in communication with the flow channel 5, so that the liquid (not shown) moves in the flow channel 5 under the pressure applied by the suction device.

Figure 8:
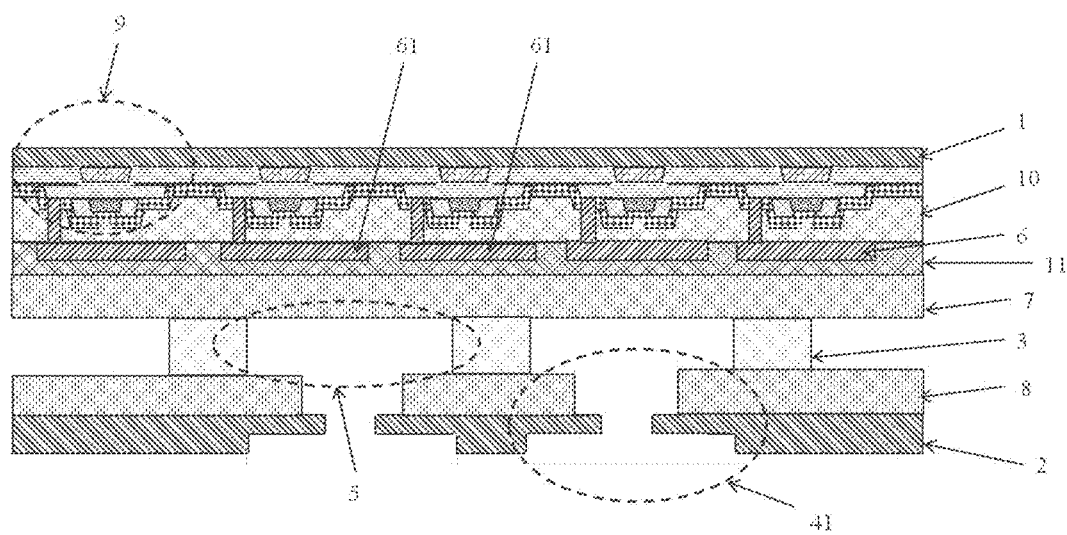
FIG. 8 shows a schematic view of a cross-sectional structure of an element pickup device according to an embodiment of the present disclosure.

According to an embodiment of the present disclosure, in some embodiments, FIG. 8 shows a schematic view of a cross-sectional structure of an element pickup device according to an embodiment of the present disclosure.

As shown in FIG. 8, the element pickup device 100 further includes: a first electrode 6 located on a side of the first substrate 1 facing the second substrate 2; a first hydrophobic layer 7 located on a side of the first electrode 6 facing the second substrate 2; and a second hydrophobic layer 8 located on a side of the second substrate 2 facing the first substrate 1. An orthographic projection of the second hydrophobic layer 8 on the first substrate 1 does not overlap with an orthographic projection of the portion of the opening 41 adjacent to the first substrate 1 on the first substrate 1.

It should be noted that the opening 41 shown in FIG. 8 is located in the laminated structure, that is, located in the laminated structure formed by the second hydrophobic layer 8 and the second substrate 2. For the description of the opening 41, reference may be made to the description of FIG. 5 above, which will not be repeated here.

In an embodiment of the present disclosure, the first electrode 6 includes a plurality of first sub-electrodes 61. The plurality of first sub-electrodes 61 are spaced apart from each other along an extending direction of the flow channel. The extending direction of the flow channel is, for example, the direction perpendicular to the paper surface in FIG. 8.

In an embodiment of the present disclosure, as shown in FIG. 8, the element pickup device 100 further includes: a thin film transistor 9 located between the first substrate 1 and the first electrode 6; a first dielectric layer 10 located between the thin film transistor 9 and the first electrode 6; and a second dielectric layer 11 located between the first electrode 6 and the first hydrophobic layer 7. An orthographic projection of the thin film transistor 9 on the first substrate 1 overlaps with an orthographic projection of the first electrode 6 on the first substrate 1.

In an embodiment of the present disclosure, although specific elements of the thin film transistor 9 are not shown in detail in FIG. 8, it can be understood that the thin film transistor 9 may include a gate, a gate insulating layer, a dielectric layer, an active layer, and source and drain electrodes. Here, by controlling the voltage applied to the first electrode 6 through the thin film transistor 9, precise control to the liquid can be achieved via the electrowetting effect.

Figure 9:
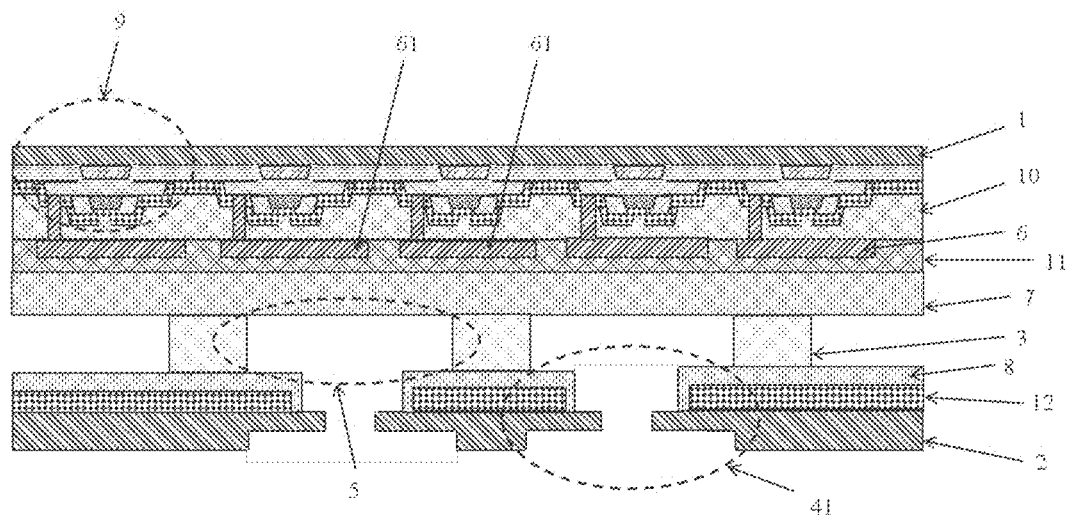
FIG. 9 shows a schematic view of a cross-sectional structure of an element pickup device according to an embodiment of the present disclosure.

According to an embodiment of the present disclosure, in some embodiments, FIG. 9 shows a schematic view of a cross-sectional structure of an element pickup device according to an embodiment of the present disclosure. FIG. 9 differs from FIG. 8 in that the element pickup device 100 further includes a second electrode 12 located between the second substrate 2 and the second hydrophobic layer 8. An orthographic projection of the second electrode 12 on the first substrate 1 is within an orthographic projection of the second hydrophobic layer 8 on the first substrate 1.

In an embodiment of the present disclosure, the spacing part 5 may include a hydrophobic material. As an example, the hydrophobic material may include Teflon, for example.

In an embodiment of the present disclosure, the material of the first substrate 1 and the second substrate 2 may include glass, plastic, silicon, polyimide, etc., for example.

In an embodiment of the present disclosure, the first dielectric layer 10 may be used as a planarization layer, for example. A material of the planarization layer may include resin, for example.

In an embodiment of the present disclosure, a material of the second dielectric layer 11 may include, for example, silicon dioxide ($SiO_2$, whose relative permittivity is 2.7), silicon nitride ($Si_3N_4$, whose relative permittivity is 7.8), and barium strontium carbonate (($BaSr$) $TiO_3$, BST, whose relative permittivity is 200-300), parylene (whose relative permittivity is 3.15), Poly(vinylidene fluoride chlorotrifluoroethylene) (P(VDF-TrFE), whose relative permittivity is 7.6-11.6) or polyimide (PI).

Figure 10:
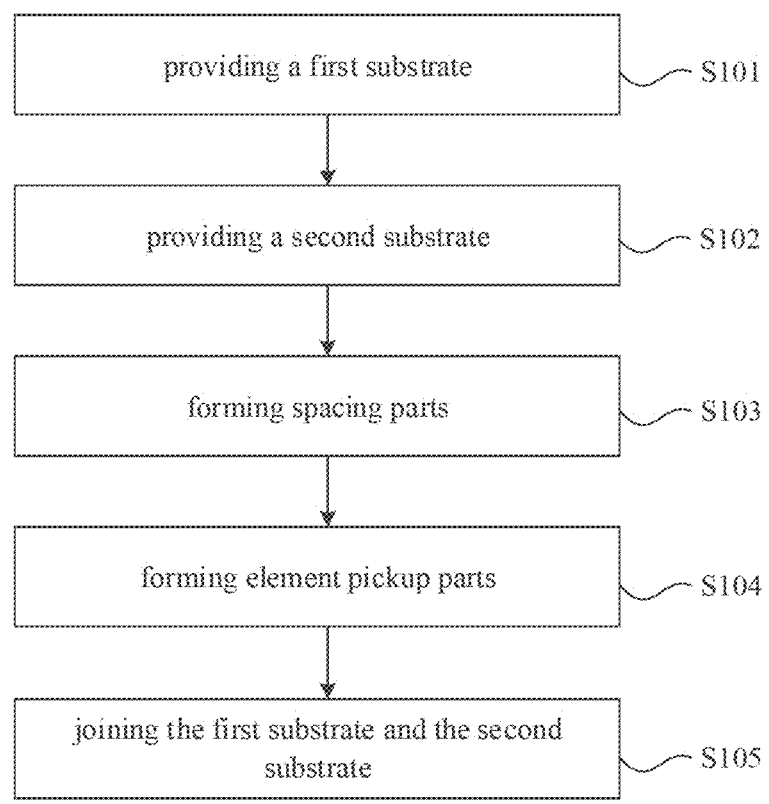
FIG. 10 shows a flowchart of a method for manufacturing an element pickup device according to an embodiment of the present disclosure.

In an embodiment of the present disclosure, a method for manufacturing the element pickup device as described above is provided. FIG. 10 shows a flowchart of a method for manufacturing an element pickup device according to an embodiment of the present disclosure. As shown in FIG. 10, the manufacturing method includes steps S101 to S105.

Next, this manufacturing method will be described with reference to FIGS. 10 to 17.

In step S101, a first substrate 1 is provided. In step S102, a second substrate 2 is provided. The order of step S101 and step S102 is not specifically limited. Or, the two steps may be performed simultaneously.

In step S103, a spacing part 3 is formed. Specifically, in an embodiment of the present disclosure, the spacing part 3 may be formed on the first substrate 1 or the second substrate 2.

Figure 11:
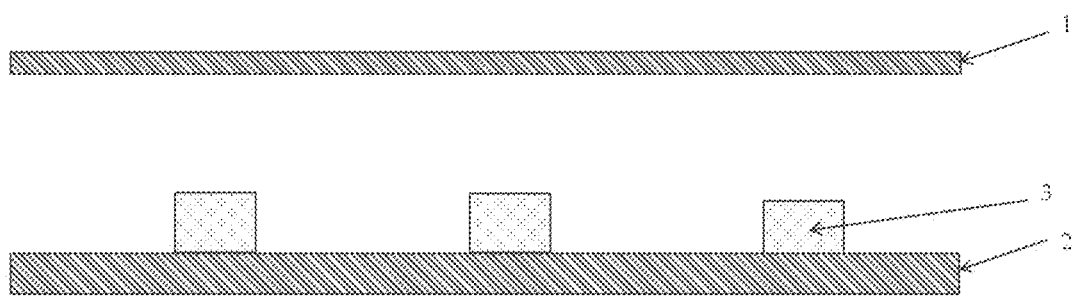
FIG. 11 shows a schematic structural view of a method for manufacturing a spacing part according to an embodiment of the present disclosure.

More specifically, FIG. 11 shows a schematic structural view of a method for manufacturing a spacing part according to an embodiment of the present disclosure. As shown in FIG. 11, the spacing part 3 is formed on the second substrate 2. The spacing parts 3 are spaced apart from each other. Specifically, a spacing part material layer may be formed on the second substrate 2 and then the spacing part material layer is patterned to form the spacing part 3.

It should be noted that FIG. 11 only shows a schematic view of forming the spacing part 3 on the second substrate 2. However, the spacing part 3 may also be formed on the first substrate 1. Those skilled in the art may select according to actual needs. The present disclosure does not specifically limit this. The detailed description of the spacing part 3 is as described above and will not be repeated here.

In step S104, an element pickup part is formed. Specifically, the element pickup part is formed on the second substrate.

Figure 12:
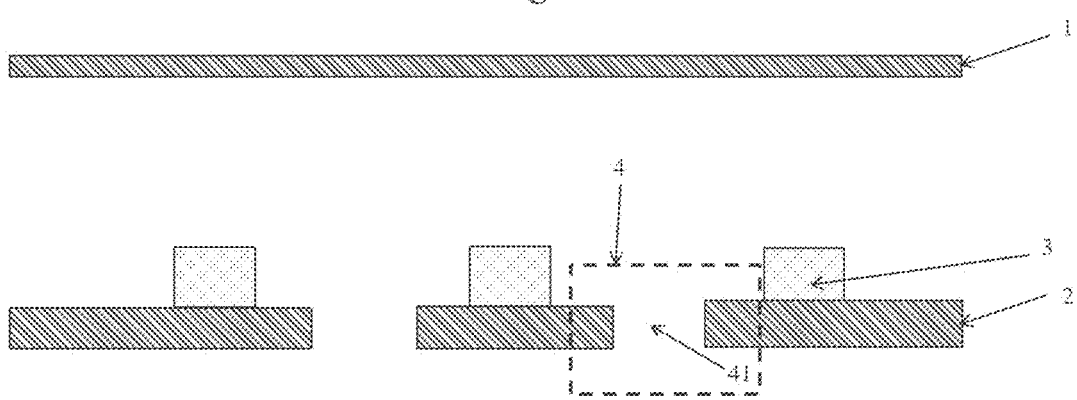
FIG. 12 shows a schematic structural view of a method for manufacturing an element pickup part according to an embodiment of the present disclosure.

More specifically, FIG. 12 shows a schematic structural view of a method for manufacturing an element pickup part according to an embodiment of the present disclosure. As shown in FIG. 12, for example, a laser etching method is used to etch the position where the element pickup part is to be formed on the second substrate 2 to form the element pickup part 4. The element pickup part 4 is formed to include an opening 41 located in the second substrate 2.

In step S105, the first substrate and the second substrate are joined.

Figure 13:
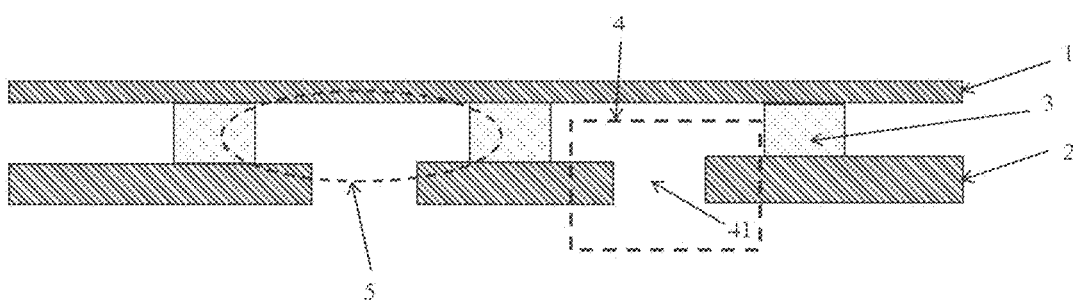
FIG. 13 shows a schematic structural view of a method for joining a first substrate and a second substrate according to an embodiment of the present disclosure.

Specifically, FIG. 13 shows a schematic structural view of a method for joining a first substrate and a second substrate according to an embodiment of the present disclosure. As shown in FIG. 12, the first substrate 1 and the second substrate 2 are joined so that the spacing part 3 is located between the first substrate 1 and the second substrate 2 to define a flow channel 5 for fluid. In an embodiment of the present disclosure, the opening 41 may be in communication with the flow channel 5. Thus, an element pickup device is formed.

In an embodiment of the present disclosure, an orthographic projection of at least a portion of the opening 41 adjacent to the first substrate 1 on the first substrate 1 is within an orthographic projection of the flow channel 5 on the first substrate 1.

Figure 14:
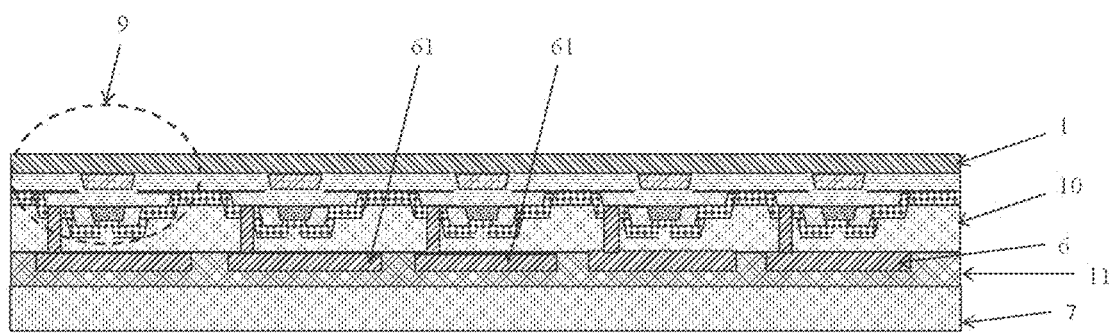
FIG. 14 shows a schematic structural view of a method for providing a first substrate according to an embodiment of the present disclosure.

In some embodiments, in an embodiment of the present disclosure, in step S101, as shown in FIG. 14, providing the first substrate 1 may include forming a first electrode 6 on the first substrate 1, and forming a first hydrophobic layer 7 on the first substrate 1 and the first electrode 6.

In an embodiment of the present disclosure, the first electrode 6 may include a plurality of first sub-electrodes 61. The plurality of first sub-electrodes 61 are spaced apart from each other along an extending direction of the flow channel. The extending direction of the flow channel is, for example, the direction perpendicular to the paper surface in FIG. 14.

In an embodiment of the present disclosure, forming a plurality of first sub-electrodes 61 includes depositing a conductive layer containing a conductive material such as metal, etc. on the first substrate 1, and patterning the conductive layer to form the plurality of first sub-electrodes 61.

In addition, referring to FIG. 14, before forming the first electrode 6, providing the first substrate 1 further includes forming a thin film transistor 9 on the first substrate 1, forming a first dielectric layer 10 covering the thin film transistor 9, and forming vias (not shown in FIG. 14) on the first dielectric layer 10. The first electrode 6 is connected to the thin film transistor 9 through the via.

In addition, referring to FIG. 14, after forming the first electrode 6 and before forming the first hydrophobic layer 7, providing the first substrate 1 further includes forming a second dielectric layer 11 to cover the first dielectric layer 10 and the first electrode 6.

Figure 15:
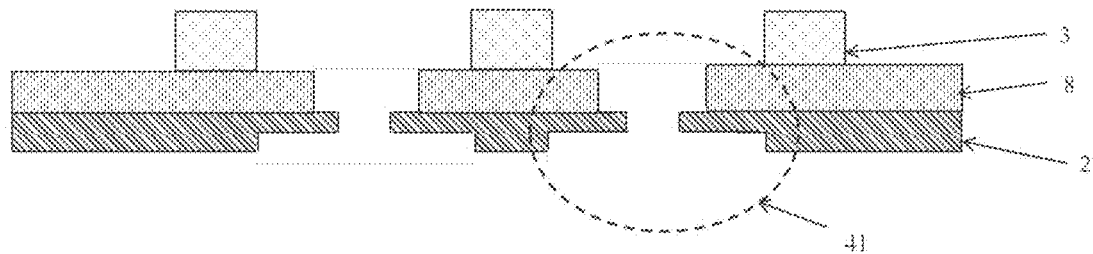
FIG. 15 shows a schematic structural view of a method for providing a second substrate according to an embodiment of the present disclosure.

In some embodiments, in an embodiment of the present disclosure, in step S102, as shown in FIG. 15, providing the second substrate 2 further includes forming a second hydrophobic layer 8 on the second substrate 2.

It should be noted that, in this embodiment, the opening 41 is located in the second hydrophobic layer 8 and the second substrate 2. Therefore, the step of etching the second substrate 2 by laser is performed after the second hydrophobic layer 8 is formed.

Figure 16:
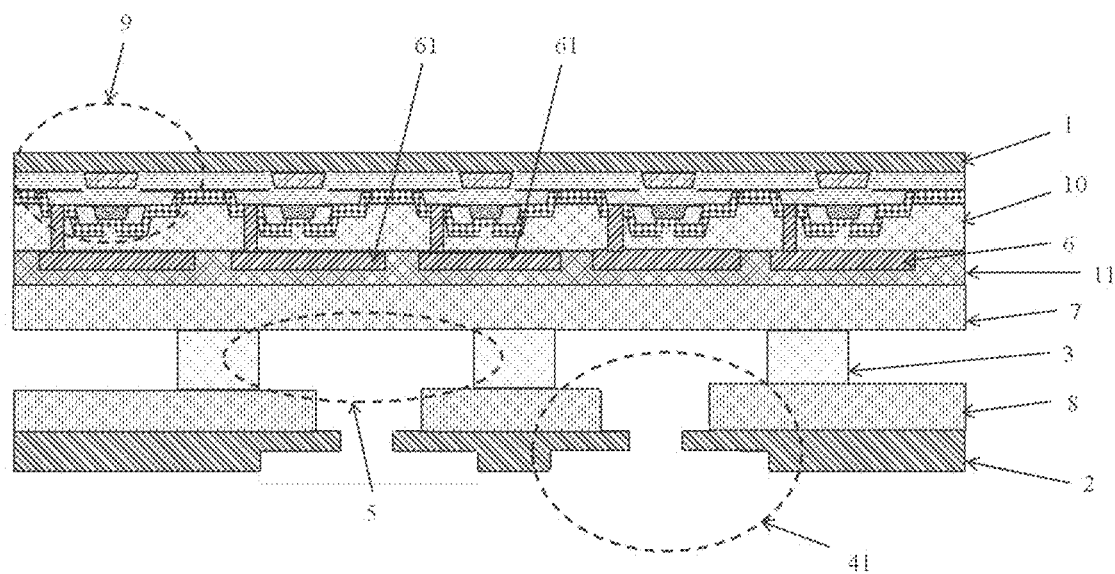
FIG. 16 shows a schematic structural view of a method for joining a first substrate and a second substrate according to an embodiment of the present disclosure.

In an embodiment of the present disclosure, in step S105, referring to FIG. 16, the first substrate 1 and the second substrate 2 are joined so that the first hydrophobic layer 7 and the second hydrophobic layer 8 are opposed to each other. In addition, after this joining, an orthographic projection of the second hydrophobic layer 8 on the first substrate 1 does not overlap with an orthographic projection of the portion of the opening 41 adjacent to the first substrate 1 on the first substrate 1. For the description of the opening 41, reference may be made to the description of FIG. 5 above, which will not be repeated here.

Figure 17:
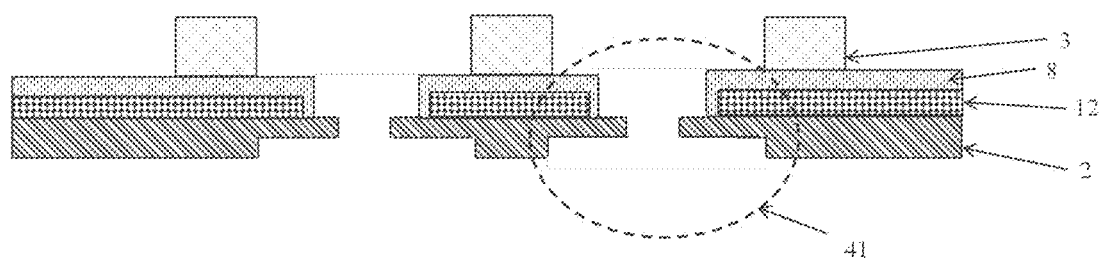
FIG. 17 shows a schematic structural view of a method for providing a second substrate according to an embodiment of the present disclosure.

According to an embodiment of the present disclosure, in step S102, as shown in FIG. 17, before forming the second hydrophobic layer 8, providing the second substrate 2 further includes forming the second electrode 12 on the second substrate 2. An orthographic projection of the second electrode 12 on the second substrate 2 is within an orthographic projection of the second hydrophobic layer 8 on the second substrate 2.

It should be noted that for a detailed description of each component in this embodiment, reference may be made to the description of the pickup device above, which will not be repeated here.

Figure 18:
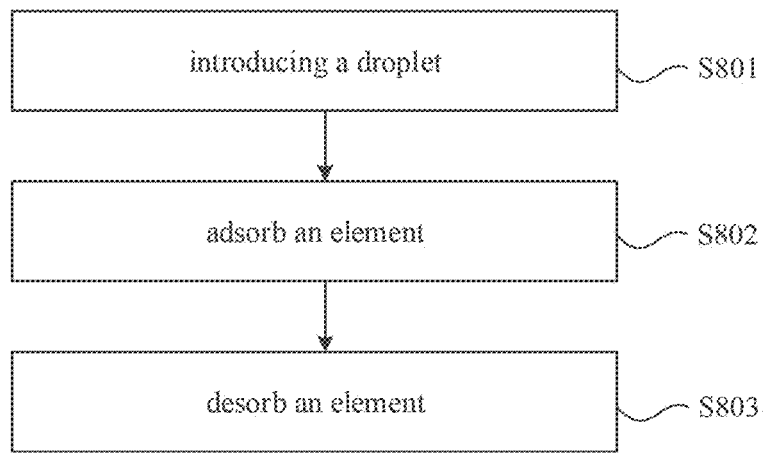
FIG. 18 shows a flowchart of a method for using an element pickup device according to an embodiment of the present disclosure.

In an embodiment of the present disclosure, a method for using the element pickup device as described above is provided. FIG. 18 shows a flowchart of a method for using an element pickup device according to an embodiment of the present disclosure. As shown in FIG. 18, the using method includes steps S801-S803.

Figure 19:
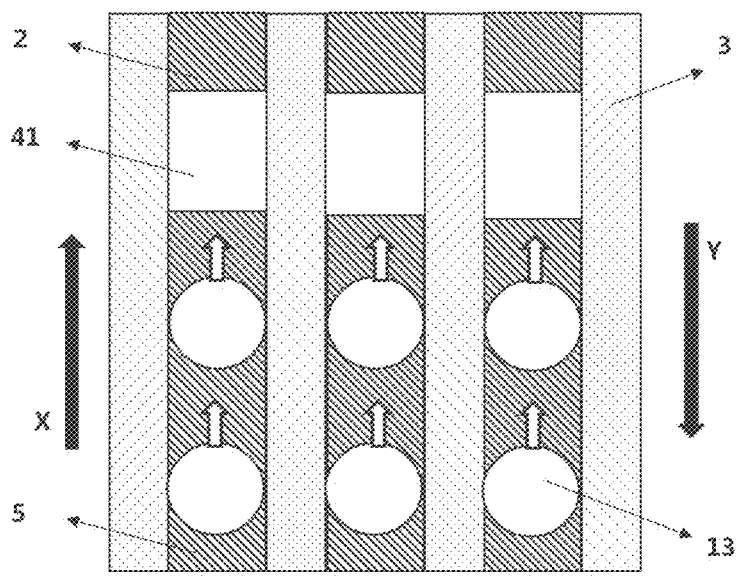
FIGS. 19 to 21 show schematic structural views of a method for using an element pickup device according to an embodiment of the present disclosure.
Figure 20:
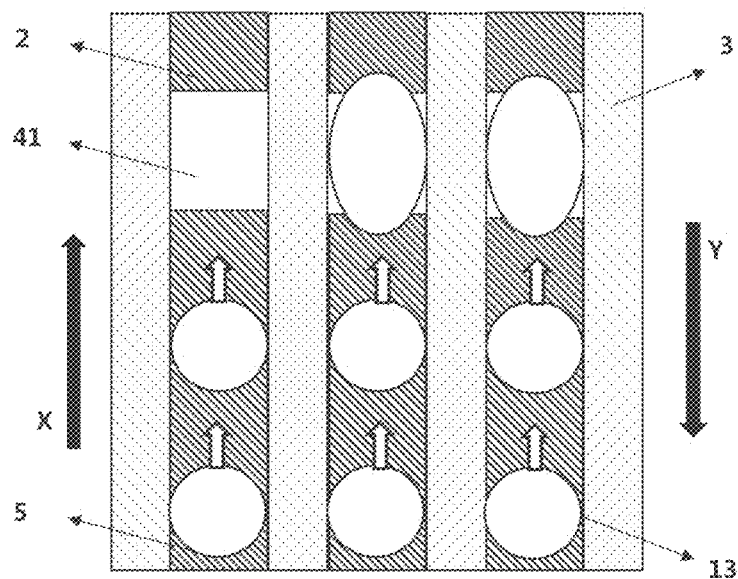
Figure 21:
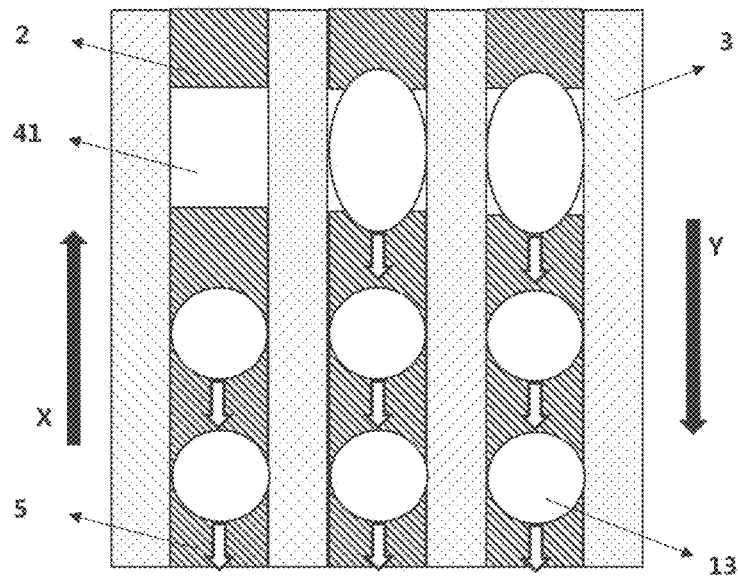

FIGS. 19 to 21 show schematic views of a method for using an element pickup device according to an embodiment of the present disclosure. It should be noted that FIGS. 19 to 21 are top views of an element pickup device according to an embodiment of the present disclosure, which are only schematic and cannot be considered as a limit to the present disclosure. In addition, in FIGS. 19 to 21, X represents a direction along which the droplet 13 moves toward the opening 41, and Y represents a direction along which the droplet 13 moves away from the opening 41.

Referring to FIG. 19, in step S801, the droplet 13 is introduced into the flow channel 5.

In an embodiment of the present disclosure, the droplet 13 may be water, for example.

Referring to FIG. 20, in step S802, the droplet 13 is moved to the opening 41 along the flow channel 5 to adsorb the element to be picked up by the droplet 13.

Referring to FIG. 21, in step S803, the droplet 13 is moved away from the opening 41 along the flow channel 5 to desorb the element.

In an embodiment of the present disclosure, the element may include, for example, a micro light emitting diode chip.

Figure 22A:
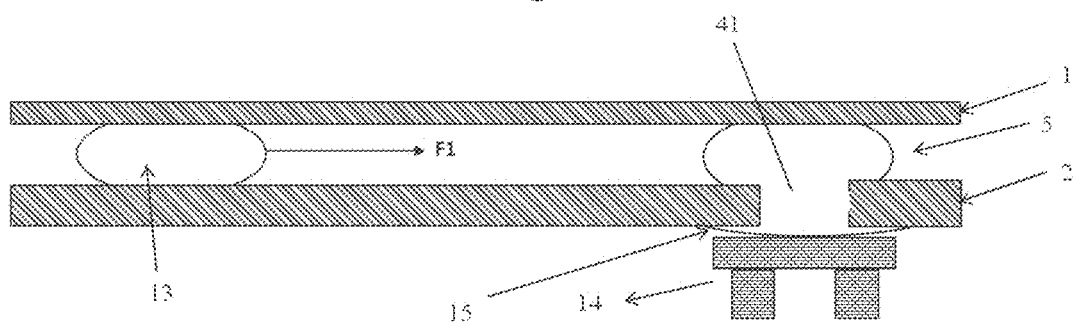
FIGS. 22a to 24b show schematic structural views of a method for using an element pickup device according to an embodiment of the present disclosure.
Figure 22B:
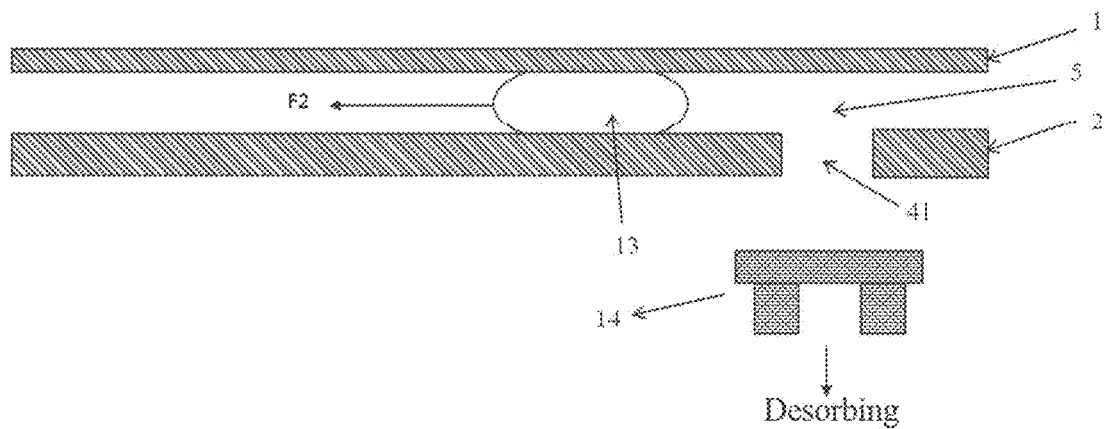

According to an embodiment of the present disclosure, FIGS. 22a and 22b show schematic views of moving elements using the element pickup device shown in FIG. 1. It should be noted that FIGS. 22a and 22b are cross-sectional views taken along a plane perpendicular to the section of FIG. 1.

In this embodiment, referring to FIG. 22a, a first pressure F1 is applied to the droplet 13 using a suction device (not shown) to move the droplet 13 to the opening 41 to adsorb the element 14 to be picked up. The first pressure F1 may be larger than the pressure in the space where the flow channel is located or larger than the pressure in the external space communicated by the opening 41. For example, the water film 15 formed by the droplet 13 adsorbs the element 14 to be picked up. More specifically, the element 14 to be picked up is adsorbed by the surface tension of the water film 15. It can be understood that the water film 15 is formed on a side of the opening 41 away from the first substrate 1 due to the surface tension of the liquid after the droplet 13 moves to the opening 41.

Referring to FIG. 22b, a second pressure F2 is applied to the droplet 13 using the suction device to move the droplet 13 away from the opening 41 to desorb the element 14, for example, to transfer the element 14 to a device such as an array backboard. A direction of the second pressure F2 is not consistent with a direction of the first pressure F1. The direction of the second pressure F2 may be opposite to the direction of the first pressure F1.

Specifically, the second pressure F2 is applied to move the droplet 13 away from the opening 41, so as to reduce the contact area of the droplet 13 with the surface of the element 14, thereby reducing the effect of the surface tension of the droplet 13 and finally causing the droplet 13 to separate from the element 14, and thus completing the transfer of the element 14, for example, a micro light emitting diode chip.

Figure 23A:
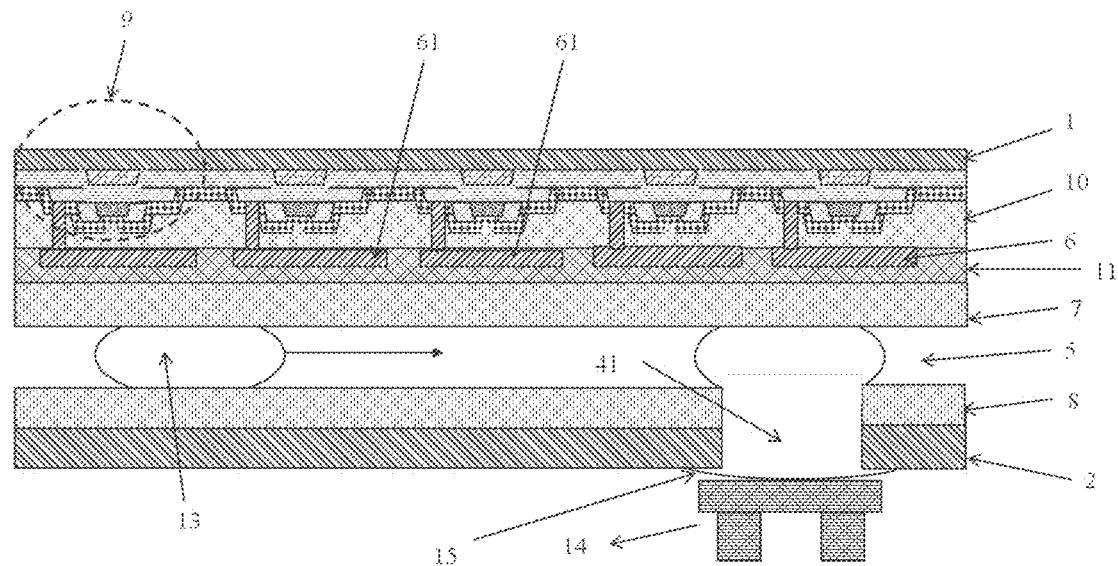
Figure 23B:
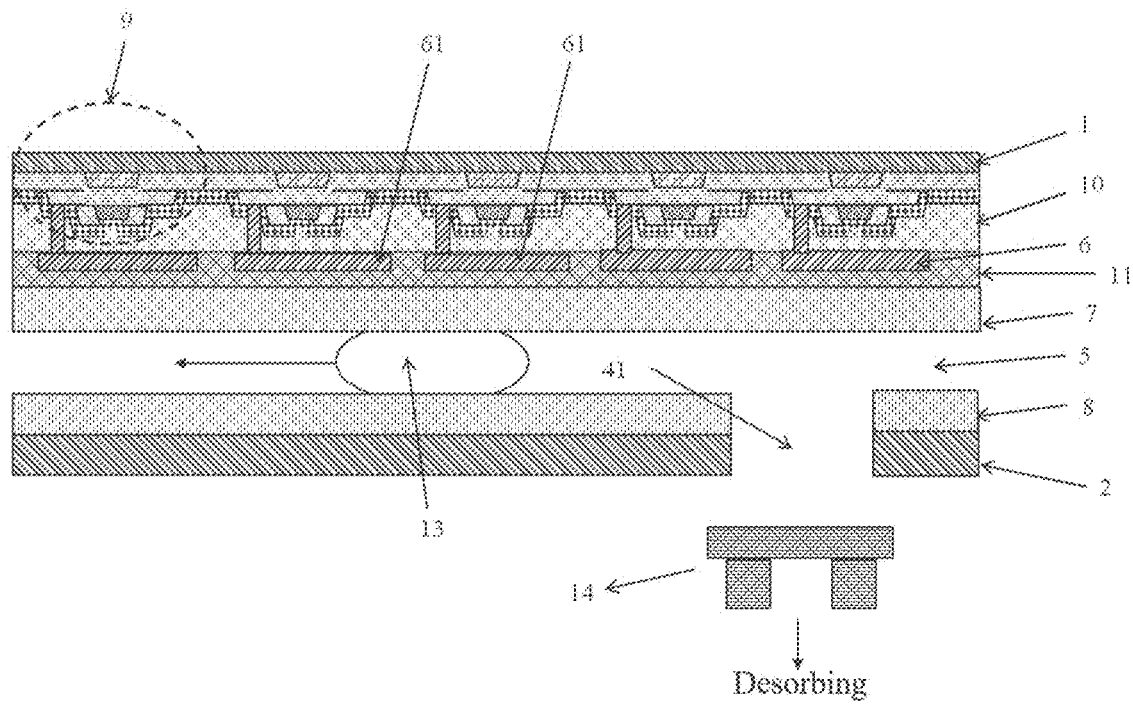

According to an embodiment of the present disclosure, FIGS. 23a and 23b show schematic views of moving elements using the element pickup device shown in FIG. 8. It should be noted that FIGS. 23a and 23b are cross-sectional views taken along a plane perpendicular to the section of FIG. 8.

In this embodiment, referring to FIG. 23a, a first voltage is applied to the first electrode 6 to move the droplet 13 to the opening 41 along the flow channel 5 to adsorb the element 14 to be picked up by the droplet 13. Applying the first voltage to the first electrode 6 includes sequentially applying the first voltage to the first sub-electrodes 61 in a direction toward the opening 41.

Referring to 23b, a second voltage is applied to the first electrode 6 to move the droplet 13 away from the opening 41 along the flow channel 5 to desorb the element 14. Applying the second voltage to the first electrode 6 includes sequentially applying the second voltage to the first sub-electrodes 61 in a direction away from the opening 41.

Figure 23C:
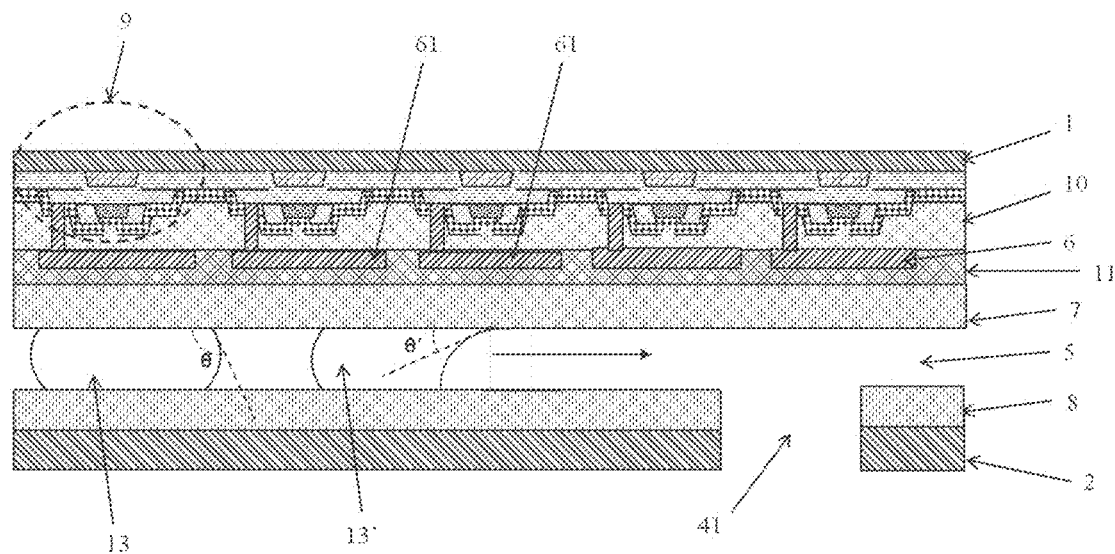

In this embodiment, the principle of the movement of the droplet 13 is described with reference to FIG. 23c. It should be noted that the droplet 13 in FIG. 23c represents the shape of the droplet where the first voltage is not applied, and the droplet 13' represents the shape of the droplet when the first voltage is applied. When it is necessary to move the droplet 13 toward the opening 41, a first voltage is sequentially applied to the first sub-electrodes 61 in the direction toward the opening 41. For example, when a first voltage is applied to the first sub-electrode 61', under the effect of the surface tension of the droplet 13 and the pressure difference inside the droplet 13, that is, under the action of electrowetting, the contact angle between the droplet and the first hydrophobic layer 7 changes. Specifically, the contact angle changes from 0 to 0'. That is, the contact angle becomes smaller. As a result, the droplet is moved toward the opening.

The principle of the movement of the droplet 13 in the direction away from the opening 41 is similar to the above, which will not be repeated here.

Figure 24A:
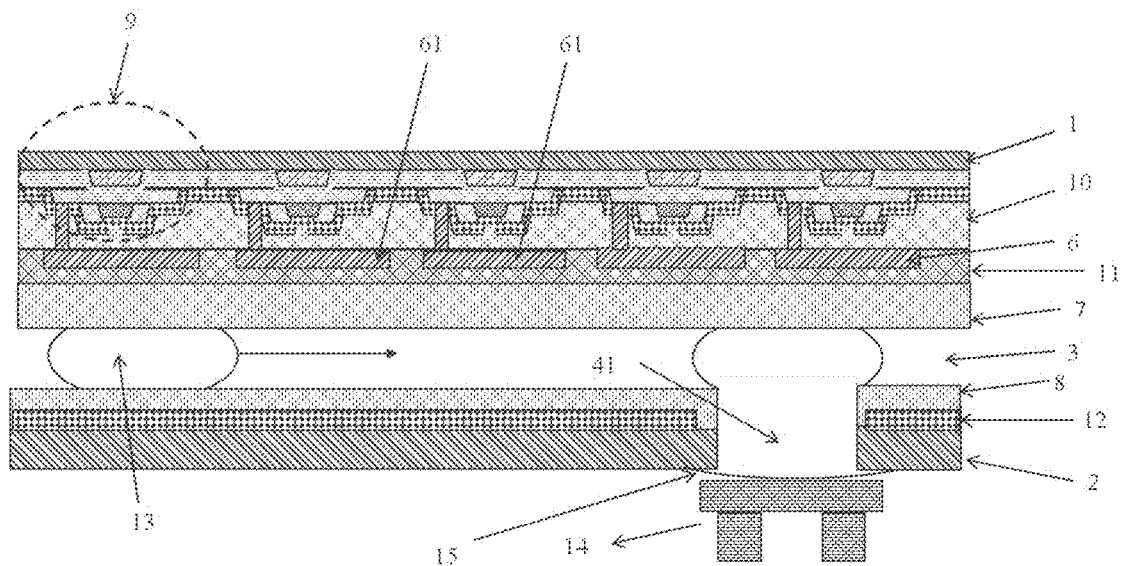
Figure 24B:
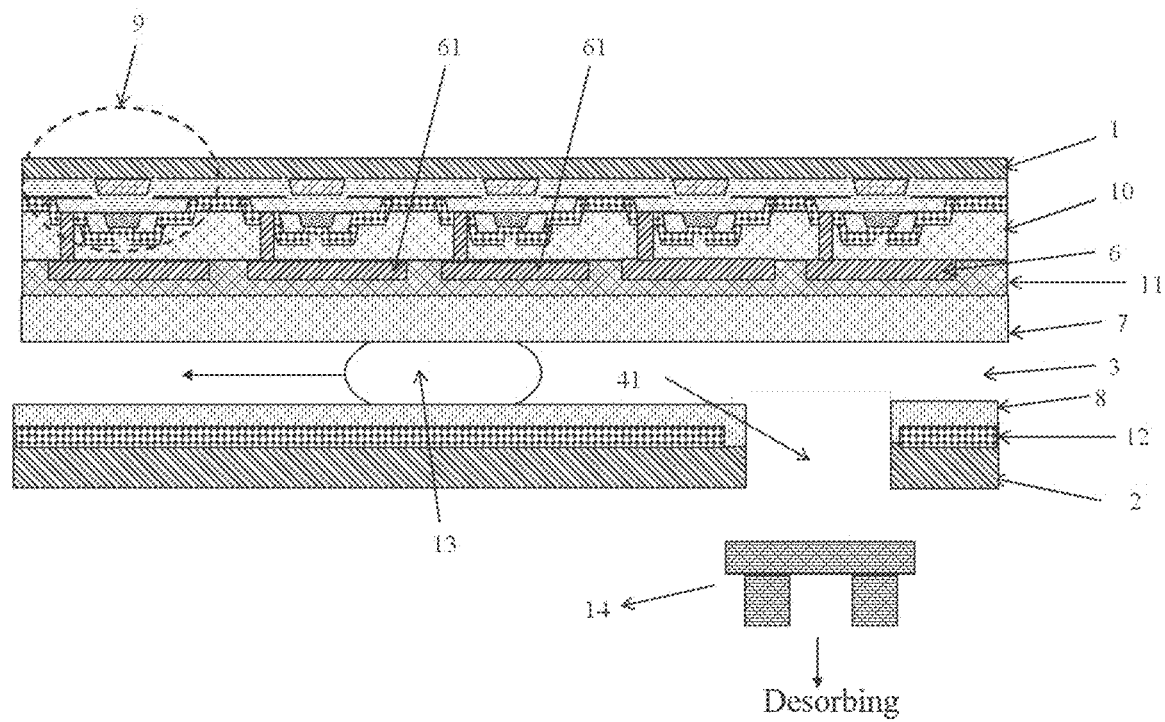

According to an embodiment of the present disclosure, FIGS. 24a and 24b show schematic views of moving elements using the element pickup device shown in FIG. 9. It should be noted that FIGS. 24a and 24b are cross-sectional views taken along a plane perpendicular to the section of FIG. 9.

In this embodiment, the element pickup device further includes a second electrode 12 located between the second substrate 2 and the second hydrophobic layer 8. Alternatively, the second electrode 12 may be grounded.

In this embodiment, referring to FIG. 24a, when a first voltage is applied to the first electrode 6, a third voltage different from the first voltage is applied to the second electrode 8, so that the droplet 13 moves to the opening 41 along the flow channel 5 to adsorb the element 14 to be picked up by the droplet 13.

Referring to FIG. 24b, when a second voltage is applied to the first electrode 6, a fourth voltage different from the second voltage is applied to the second electrode 12 to desorb the element 14.

The principle of the movement of the droplet 13 is similar to that described above with respect to FIG. 23c, which will not be repeated here.

In an embodiment of the present disclosure, before picking up the element 14, a surface of the element 14 is subjected to hydrophilic treatment, so that the element 14 to be picked up can be adsorbed by the surface tension of the droplet 13.

In an embodiment of the present disclosure, a method for performing a hydrophilic treatment on the surface of the element 14 includes performing an oxygen plasma treatment on the surface of the element 14 or applying a surfactant to the surface of the element 14.

Specifically, oxygen plasma treatment is performed on the surface of the element 14 to form hydroxyl groups on the surface of the element.

As an example, the surfactant includes sodium dodecyl sulfate (SDS, molecular formula of which is $CH_3(CH_2)_{11}OSO_3Na$), polyethylene glycol (PEG), polyvinyl alcohol (PVA) or polymethacrylic acid (PMAA).

The element pickup device, the method for manufacturing the same, and the method for using the same provided by the embodiments of the present disclosure can obtain the following benefits: transferring elements by employing physical tension to prevent the adverse effects of static electricity on the elements, transferring elements by employing digital micro fluidic technology (i.e., employing the technology of the first electrode or the first electrode and the second electrode in the embodiments of the present disclosure), so as to reduce the consumption of droplets used and thus continuously transfer elements, and using a thin film transistor array as a switch for driving electrodes, so as to precisely control the behavior of the droplets and thus precisely control the picking up and dropping of elements.

The foregoing description of the embodiment has been provided for purpose of illustration and description. It is not intended to be exhaustive or to limit the application. Even if not specifically shown or described, individual elements or features of a particular embodiment are generally not limited to that particular embodiment, are interchangeable when under a suitable condition, can be used in a selected embodiment and may also be varied in many ways. Such variations are not to be regarded as a departure from the application, and all such modifications are included within the scope of the application.

What is claimed is:

1. An element pickup device, comprising:
   a first substrate and a second substrate oppositely disposed;
   spacing parts located between the first substrate and the second substrate, wherein the spacing parts are spaced apart from each other to define a flow channel for liquid; and
   an element pickup part comprising an opening located in the second substrate and in communication with the flow channel,
   wherein the element pickup device picks up the element by a surface tension of droplets from the liquid.

2. The element pickup device according to claim 1, wherein an orthographic projection of at least a portion, adjacent to the first substrate, of the opening on the first substrate is located within an orthographic projection of the flow channel on the first substrate.

3. The element pickup device according to claim 2, wherein a shape of a section of the opening perpendicular to a plane where the second substrate is located is rectangular.

4. The element pickup device according to claim 2, wherein the opening comprises a first portion and a second portion in communication with each other, wherein the first portion is located on a side of the second substrate facing the first substrate, and wherein the second portion is located on a side of the second substrate away from the first substrate.

5. The element pickup device according to claim 4, wherein a first section of the first portion along a plane parallel to the first substrate is not smaller than a second section of the second portion along the plane parallel to the first substrate.

6. The element pickup device according to claim 5, wherein the opening further comprises a third portion located between the first portion and the second portion,
and wherein a third section of the third portion along a plane parallel to a plane where the first substrate is located is not larger than the first section and the second section.

7. The element pickup device according to claim 4, wherein a first section of the first portion along a plane parallel to the first substrate is not lager than a second section of the second portion along the plane parallel to the first substrate.

8. The element pickup device according to claim 4, wherein a size of a first section of the first portion along a plane parallel to a plane where the first substrate is located is inversely proportional to a distance from the first section to the first substrate,
and wherein a size of a second section of the second portion along a plane parallel to a plane where the first substrate is located is proportional to a distance from the second section to the first substrate.

9. The element pickup device according to claim 2, wherein the opening comprises a first opening and a second opening spaced apart.

10. The element pickup device according to claim 1, further comprising:
a first electrode located on a side of the first substrate facing the second substrate;
a first hydrophobic layer located on a side of the first electrode facing the second substrate; and
a second hydrophobic layer located on a side of the second substrate facing the first substrate,
wherein an orthographic projection of the second hydrophobic layer on the first substrate does not overlap with an orthographic projection of a portion, adjacent to the first substrate, of the opening on the first substrate.

11. The element pickup device according to claim 10, wherein the first electrode comprises a plurality of first sub-electrodes, the plurality of first sub-electrodes being spaced apart from each other along an extending direction of the flow channel.

12. The element pickup device according to claim 11, further comprising a second electrode located between the second substrate and the second hydrophobic layer,
wherein an orthographic projection of the second electrode on the first substrate is located within an orthographic projection of the second hydrophobic layer on the first substrate.

13. The element pickup device according to claim 10, further comprising:
a thin film transistor located between the first substrate and the first electrode;
a first dielectric layer located between the thin film transistor and the first electrode, wherein an orthographic projection of the thin film transistor on the first substrate overlaps with an orthographic projection of the first electrode on the first substrate; and
a second dielectric layer located between the first electrode and the first hydrophobic layer.

14. The element pickup device according to claim 1, further comprising a suction device in communication with the flow channel.

15. The element pickup device according to claim 1, wherein the spacing parts comprise a hydrophobic material.

16. A method for manufacturing the element pickup device according to claim 1, comprising:
providing a first substrate;
providing a second substrate;
forming spacing parts on the first substrate or on the second substrate, the spacing parts being spaced apart from each other;
forming element pickup parts on the second substrate, the element pickup part being formed to comprise an opening located in the second substrate; and
joining the first substrate and the second substrate so that the spacing parts are located between the first substrate and the second substrate to define a flow channel for fluid,
wherein the opening is in communication with the flow channel,
wherein the element pickup device picks up the element by a surface tension of droplets from the liquid,
wherein an orthographic projection of at least a portion, adjacent to the first substrate, of the opening on the first substrate is located within an orthographic projection of the flow channel on the first substrate,
wherein providing the first substrate comprises:
forming a first electrode on the first substrate, and
forming a first hydrophobic layer on the first substrate and the first electrode,
wherein providing the second substrate comprises:
forming a second hydrophobic layer on the second substrate,
wherein the first substrate and the second substrate are joined so that the first hydrophobic layer and the second hydrophobic layer are opposed to each other,
and wherein after the joining, an orthographic projection of the second hydrophobic layer on the first substrate does not overlap with an orthographic projection of a portion, adjacent to the first substrate, of the opening on the first substrate,
wherein the first electrodes are formed to be spaced apart from each other along an extending direction of the flow channel.

17. The method according to claim 16, wherein providing the second substrate further comprises forming a second electrode on the second substrate before forming the second hydrophobic layer,
wherein an orthographic projection of the second electrode on the second substrate is located within an orthographic projection of the second hydrophobic layer on the second substrate.

18. A method for using the element pickup device according to claim 1, comprising:
introducing a droplet into the flow channel;
moving the droplet to the opening along the flow channel to adsorb an element to be picked up by the droplet, wherein the element pickup device adsorb the element by a surface tension of the droplet; and
moving the droplet away from the opening along the flow channel to desorb the element.

19. The method for using an element pickup device according to claim 18, wherein
moving the droplet to the opening along the flow channel comprises applying a first pressure to the droplet; and
wherein moving the droplet away from the opening along the flow channel comprises applying a second pressure to the droplet.

20. The method for using an element pickup device according to claim 18, wherein the element pickup device further comprises a first electrode located on a side of the first substrate facing the second substrate, a first hydrophobic layer located on a side of the first electrode facing the second substrate, and a second hydrophobic layer located on a side of the second substrate facing the first substrate, wherein the method comprises:
- applying a first voltage to the first electrode to move the droplet to the opening along the flow channel to adsorb the element to be picked up by the droplet; and
- applying a second voltage to the first electrode to move the droplet away from the opening along the flow channel to desorb the element,
- wherein the element pickup device further comprises a second electrode located between the second substrate and the second hydrophobic layer,
- wherein applying a first voltage to the first electrode to move the droplet to the opening along the flow channel to adsorb the element to be picked up by the droplet further comprises:
- applying a third voltage different from the first voltage to the second electrode when the first voltage is applied,
- and wherein moving the droplet away from the opening along the flow channel to desorb the element further comprises:
- applying a fourth voltage different from the second voltage to the second electrode when the second voltage is applied.

* * * * *